(12) United States Patent
Close et al.

(10) Patent No.: US 11,435,413 B2
(45) Date of Patent: Sep. 6, 2022

(54) STRAY FIELD REJECTION IN MAGNETIC SENSORS

(71) Applicant: Melexis Technologies SA, Bevaix (CH)

(72) Inventors: Gael Close, Morges (CH); Arnaud Laville, Neuchatel (CH); Stefan Rigert, Malters (CH); Samuel Huber Lindenberger, Jenaz (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 97 days.

(21) Appl. No.: 17/018,775

(22) Filed: Sep. 11, 2020

(65) Prior Publication Data

US 2020/0408853 A1    Dec. 31, 2020

Related U.S. Application Data

(63) Continuation of application No. 16/118,638, filed on Aug. 31, 2018, now Pat. No. 10,809,314.

(30) Foreign Application Priority Data

Sep. 13, 2017    (EP) .................................... 17190942

(51) Int. Cl.
*G01R 33/00* (2006.01)
*G01D 18/00* (2006.01)
(Continued)

(52) U.S. Cl.
CPC ......... *G01R 33/0017* (2013.01); *G01D 5/142* (2013.01); *G01D 18/00* (2013.01);
(Continued)

(58) Field of Classification Search
CPC ............ G01R 33/0017; G01R 33/0041; G01R 33/07; G01R 35/00; G01R 33/0035;
(Continued)

(56) References Cited

U.S. PATENT DOCUMENTS 4,072,200 A   2/1978   Morris et al.
4,933,640 A   6/1990   Kuckes
(Continued)

OTHER PUBLICATIONS

Cok et al., "AMOLED Displays With Transfer-Printed Integrated Circuits," Journal oftheSID, vol. 19, No. 4, Apr. 1, 2011, pp. 335-341.
(Continued)

*Primary Examiner* — Giovanni Astacio-Oquendo
(74) *Attorney, Agent, or Firm* — Workman Nydegger

(57) ABSTRACT

The present invention relates to a field-sensor device comprising a reference field sensor providing a reference sensor signal in response to a field, a calibrated field sensor providing a calibrated sensor signal in response to the field, a reference circuit connected to the reference field sensor and adapted to receive a reference signal, and an adjustable circuit connected to the calibrated field sensor and adapted to receive a calibrated signal. When the adjustable circuit is adjusted with the calibrated signal, said calibrated signal being different from the reference signal, the calibrated field sensor provides a calibrated sensor signal substantially equal to the reference sensor signal. The field sensor device is arranged to be exposed, when in a calibration mode, to a uniform calibration field and, when in operational mode, to an operational field being a field gradient.

14 Claims, 4 Drawing Sheets

(51) Int. Cl.
  *G01D 5/14* (2006.01)
  *G01R 33/07* (2006.01)
  *G01R 35/00* (2006.01)

(52) U.S. Cl.
  CPC ......... *G01R 33/0041* (2013.01); *G01R 33/07* (2013.01); *G01R 35/00* (2013.01)

(58) Field of Classification Search
  CPC .............. G01R 33/0082; G01R 33/025; G01R 33/0023; G01D 5/142; G01D 18/00
  USPC ........................ 324/202, 207.11, 207.13, 200
  See application file for complete search history.

(56) References Cited

U.S. PATENT DOCUMENTS

| | | | |
|---|---|---|---|
| 6,479,987 | B1 | 11/2002 | Marx et al. |
| 9,523,589 | B2 | 12/2016 | Nakamura et al. |
| 11,143,732 | B2* | 10/2021 | Romero ................ G01D 5/147 |
| 11,163,019 | B1* | 11/2021 | Chaware .............. G01R 33/022 |
| 2002/0062992 | A1 | 5/2002 | Fredericks et al. |
| 2002/0067162 | A1 | 6/2002 | Dammkohler et al. |
| 2008/0177499 | A1* | 7/2008 | Maone ................... G01P 13/02 702/147 |
| 2014/0210479 | A1 | 7/2014 | Rink et al. |
| 2016/0093600 | A1 | 3/2016 | Bower et al. |
| 2016/0169983 | A1 | 6/2016 | Chang et al. |
| 2016/0299200 | A1 | 10/2016 | Taylor et al. |
| 2017/0030979 | A1 | 2/2017 | Cesaretti |
| 2019/0079142 | A1* | 3/2019 | Close ..................... G01D 18/00 |
| 2019/0265324 | A1* | 8/2019 | Bilbao De Mendizabal ............... G01R 33/07 |
| 2021/0293901 | A1* | 9/2021 | Dupre ................ G01R 33/0035 |

OTHER PUBLICATIONS

Extended European Search Report from EP Application No. 17190942.7, dated Feb. 26, 2018.

* cited by examiner

STRAY FIELD REJECTION IN MAGNETIC SENSORS

FIELD OF THE INVENTION

The present invention is generally related to the domain of field sensor devices having improved stray field rejection and reduced variability.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or magneto-resistive materials whose electrical resistance changes in response to an external magnetic field. In many applications, it is desirable that sensors are small and are integrated with electronic processing circuitry so as to reduce the overall sensor size and provide improved measurements and integration into external electronic systems. For example, US2016/299200 describes a Hall-effect magnetic sensor for measuring magnetic fields incorporating an integrated circuit formed in a semiconductor material on a substrate, together with insulation and adhesive layers.

Magnetic sensors are often used to detect the position of a moving mechanical structure, for example a rotating element incorporating a magnet (a magnetic position sensor). U.S. Pat. No. 9,523,589 describes a rotation angle measurement apparatus having four Hall element pairs for detecting magnetic field components in four different directions and used to calculate the position of a rotating magnet.

In any manufacturing process, materials and structures vary so that the manufactured devices vary somewhat. In particular, manufactured sensors can provide slightly varying output when exposed to an environmental attribute of the same magnitude. For example, magnetic Hall sensors formed on a semiconductor wafer can produce signals that vary by several percent due to variations in the quality of epitaxial materials in the wafer and variations in the photo-lithographic process methods or due to the local variation of mechanical stress, for example arising from temperature changes of packaged devices and a mismatch of the thermal coefficients of expansion of the electronic circuit and its surrounding packaging material in the packaged device.

Various approaches to improving the consistency of sensors and their measurements are known. In one simple example, multiple, redundant sensors can be employed and their sensed values averaged to reduce overall variability. Nonetheless, significant measurement errors are still possible. In some sensor applications, the sensors can be calibrated or re-calibrated to ensure that their measurements conform to an external standard. However, in other applications such calibration is not possible, difficult or too expensive.

Moreover, field sensors are subject to measurement error due to stray fields that are unrelated to the field whose measurement is desired. For example, a compass is intended to measure the earth's magnetic field but can be affected by local magnetic field sources, such as motors or other electrical machinery that produce stray magnetic fields. Conversely, a magnetic sensor designed to measure the temporal variation of the magnetic field produced by a rotating magnet can be affected by the earth's magnetic field, fields from other unrelated electrical machinery or electromagnetic interference. Hence, stray field rejection is an important attribute of practical field sensor designs, such as position sensors.

One approach to reducing stray field rejection is to increase the useful signal from the sensor, for example by employing a magnet with a stronger magnetization or by bringing the magnet closer to the sensor, so that the relative contribution of the undesired external field to the sensed signal is reduced. However, this can require larger, heavier or bulkier magnets and/or more accurate mechanical assembly with more stringent tolerances, thereby increasing size and/or cost. For example, one commercially available design requires magnets capable of producing 70 mT magnetic fields. In contrast, many sensor applications require increased sensitivity, accuracy, precision and reduced costs.

There is a need, therefore, for improved field sensor devices that provide increased stray field rejection and improved accuracy.

SUMMARY OF THE INVENTION

It is an object of embodiments of the present invention to provide for a field sensor device wherein one or more of the above-mentioned drawbacks and limitations are avoided or overcome. It is also an object to provide a method of calibrating such device. It is a further object to propose a way of operating the field sensor device.

The above objective is accomplished by the solution according to the present invention.

Embodiments of the present invention provide a field-sensor device comprising a reference field sensor biased with a reference current, the reference field sensor providing a reference sensor signal in response to a field, and a calibrated field sensor biased with an adjustable current, the calibrated field sensor providing a calibrated sensor signal in response to the field. When the adjustable current of the calibrated field sensor is equal to the reference current, the reference sensor signal is not equal to the calibrated sensor signal (for example due to difference in materials, manufacturing or assembly). When the calibrated field sensor is biased at a calibrated current different from the reference current, the calibrated field sensor provides a calibrated sensor signal substantially equal to the reference sensor signal. The field sensor device is arranged to be exposed, when in a calibration mode, to a uniform calibration field and, when in operational mode, to an operational field being a field gradient.

In various configurations of the present invention, the field-sensor device can comprise a plurality of calibrated field sensors. The field can be a magnetic field, an electric field, a pressure field or a gravitational field. The reference field sensor and the one or more calibrated field sensors can be biased at a common reference voltage.

In an embodiment, the field-sensor device comprises a control circuit that controls the adjustable current bias of the calibrated field sensor at a calibrated current different from the reference current so that the calibrated field sensor provides a calibrated sensor signal substantially equal to the reference sensor signal. The control circuit can comprise a reference current source that provides the reference current and an adjustable current source that provides the adjustable current. The control circuit can comprise a comparator that compares the reference sensor signal to the calibrated sensor signals. The control circuit can comprise a converter that converts the reference sensor signal, the calibrated sensor signal or both the reference sensor signal and the calibrated sensor signal into digital signals.

In some embodiments, the reference field sensor, the calibrated field sensor or both the reference field sensor and the calibrated field sensor are digital sensors providing their sensor signals in digital form, or the reference sensor signal, the calibrated sensor signal or both the reference sensor signal and the calibrated sensor signal are digital signals. In other embodiments, the reference field sensor, the calibrated field sensor or both the reference field sensor and the calibrated field sensor are analog sensors providing their sensor signals in analog form or the reference sensor signal, the calibrated sensor signal or both the reference sensor signal and the calibrated sensor signal are analog signals.

A method of calibrating the field-sensor device in an embodiment of the present invention comprises: providing a field (for example a calibration field) to both the reference field sensor and the calibrated field sensor; comparing the reference sensor signal and the calibrated sensor signal provided by the reference field sensor and the calibrated field sensor, respectively; if the reference sensor signal and the calibrated sensor signal are substantially not equal, biasing the calibrated field sensor with an adjusted current in response to the comparison signal; and repeatedly comparing the reference sensor signal and the calibrated sensor signal and adjusting the calibrated sensor signal until the calibrated sensor signal substantially equals the reference sensor signal, for example within a desired tolerance.

In one embodiment the above-mentioned steps are performed before providing the field sensor device to a customer and after providing the field-sensor device to the customer the steps are performed of providing an operational field to said reference field sensor, said calibrated field sensor or to both said reference field sensor and said calibrated field sensor and outputting said reference sensor signal, said calibrated sensor signal, both said reference sensor signal and said calibrated sensor signal or a combination of said reference sensor signal and said calibrated sensor signal.

A further method of the present invention, comprises operating the field-sensor device by providing an operational field to the reference field sensor, the calibrated field sensor or to both the reference field sensor and the calibrated field sensor and outputting the reference sensor signal, the calibrated sensor signal, both the reference sensor signal and the calibrated sensor signal, or a combination of the reference sensor signal and the calibrated sensor signal.

Methods of the present invention can further include processing the reference sensor signal and the calibrated sensor signal to form a gradient signal. Such a gradient signal is generated through the difference between the reference sensor signal and the calibrated sensor signal. If both sensors have the same sensitivity, then this difference represents the difference in the local field sensed by each sensor, which, divided by the known distance of both sensors, is the field gradient.

In some configurations, the field-sensor device comprises a plurality of calibrated field sensors and a method of the present invention comprises processing two or more of the calibrated sensor signals from the plurality of calibrated field sensors to provide a gradient signal. In another configuration, the field-sensor device comprises a plurality of calibrated field sensors and a method of the present invention comprises combining the calibrated sensor signal from each calibrated field sensor to provide a combined sensor signal. In some embodiments, the reference or calibrated field sensors measure different vector components of a field having both direction and magnitude, or the reference or calibrated field sensors measure different combinations of the field vector components (e.g., $B_x$, $B_y$, $B_z$ magnetic field components).

Embodiments of the present invention provide a field sensor device with sensor field signals having improved accuracy and precision and improved stray field rejection.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

Figure 1:
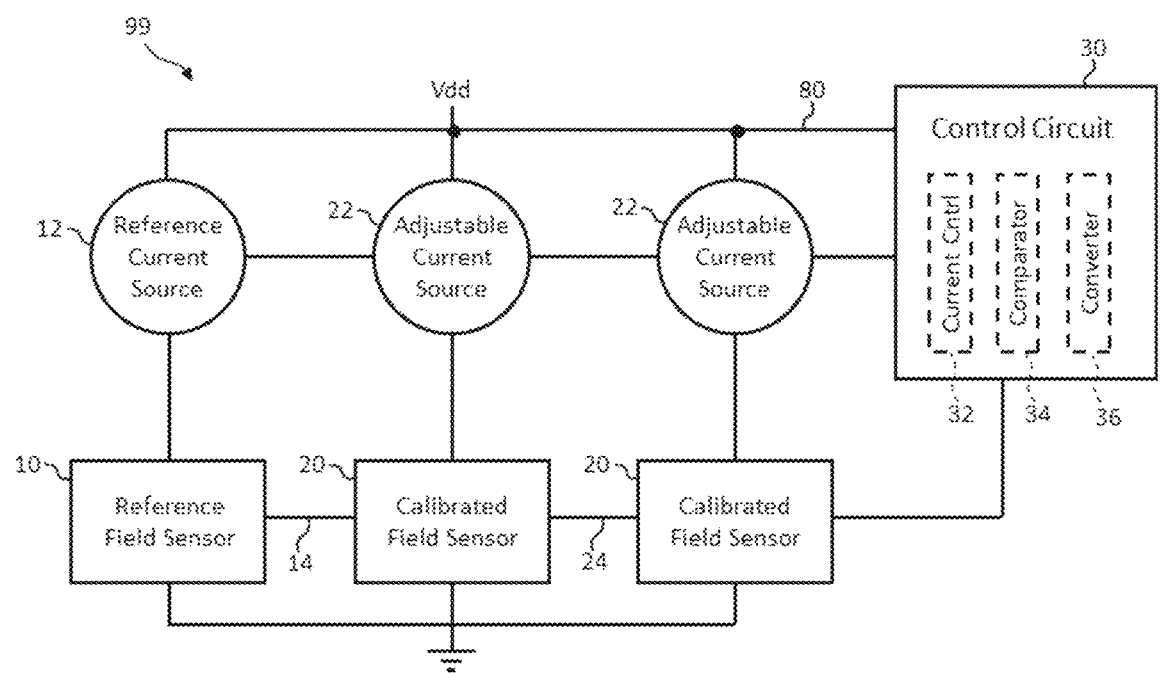
FIG. 1 illustrates a simplified schematic of an illustrative embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF ILLUSTRATIVE EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention provide field sensor devices having improved stray field rejection and reduced variability. Referring to the simplified circuit schematic of FIG. 1, a field-sensor device 99 comprises a reference field sensor 10 and one or more calibrated field sensors 20. The reference field sensors 10 are biased with a reference current provided by a reference current source 12 and the one or more calibrated field sensors 20 are each biased with an individually adjustable current provided by an adjustable current source 22. An adjustable current source can change the provided current to different current magnitudes, for example under the control of a control circuit 30. The reference field sensor 10 provides a reference sensor signal 14 in response to a field and the one or more calibrated field sensors 20 each provide a separate calibrated sensor signal 24 in response to the field. For clarity of exposition, the various control and sensor signals are not individually distinguished in FIG. 1. The reference sensor signal 14 and the calibrated sensor signals 24 can be connected to the control circuit 30 or an external system (not shown for clarity) by a wire 80 or a collection of wires 80 (a bus) and can be differential signals. Although shown as separate elements, the reference current source 12 and the adjustable current sources 22 can be considered to be a part of or are controlled by, the control circuit 30 and the control circuit 30 can comprise the reference current source 12 and the calibrated current sources 22. Furthermore, the reference field sensor 10 and one or more of the calibrated field sensors 20 or their supporting circuitry can be integrated into a common circuit or are part of a common device or structure and can be disposed on a common device substrate and separated by a distance equal to or less than 10 mm, 5 mm, 2 mm, 1 mm, 0.5 mm, 0.2 mm, 0.1 mm or 0.05 mm so that they can more readily sense the same field.

When the adjustable current of each of the one or more calibrated field sensors 20 is equal to the reference current, the reference sensor signal 14 is substantially not equal to the calibrated sensor signals 24 produced by the one or more calibrated field sensors 20. Thus, the one or more calibrated field sensors 20 produce a different sensor signal than the reference field sensor 10 when exposed to the same field and biased with the same current so that the calibrated field sensors 20 and the reference field sensor 10 are mismatched at a common current bias, for example due to manufacturing and materials variation or variations in mechanical stress. In contrast, when the calibrated field sensor 20 is biased at a calibrated current different from the reference current, the calibrated field sensor 20 provides a calibrated sensor signal 24 substantially equal to the reference sensor signal 14.

By substantially equal is meant within the manufacturing and materials variation of the field sensor device 99 or a desired tolerance for the field sensor device 99. For example, a difference of 0.1% between the reference sensor signal 14 and the calibrated sensor signal 24 or between the different multiple calibrated sensor signals 24 can be acceptable for a field sensor device 99 specification and thus within the meaning of "substantially equal" in that case although a 1% variation is not acceptable and thus is no "substantially equal". The desired tolerance for "substantially equal" can depend on the magnitude of a common versus the differential portion of a field. The common field indicates the portion of the field that is the same for the various field sensors (reference and one or more calibrated field sensors 10, 20) in the field sensor device 99. The differential field is the portion of the field that is different for the various field sensors in the field sensor device 99. Since the various field sensors are disposed in different locations in the field sensor device 99, a non-uniform field can produce different field measurements at the different locations of the various field sensors. The calibration (selection of adjusted current for each calibrated field sensor 20) should be based on matching the bias currents required to provide an identical sensor signal from the various field sensors in response to the common (uniform) field. If the different part is zero (the field gradient is zero), then the field is uniform for the various field sensors in the field sensor device 99. If the field is not uniform (has a gradient) and a field gradient measurement is desired, the gradient is the difference in the field measurements of the various field sensors, calculated by a subtraction of one field sensor signal from another field sensor signal and can include combined differences between the various field sensors.

According to embodiments of the present invention, the stray field is a field portion common to both the reference field sensor 10 and the one or more calibrated field sensors 20. Thus, the calibrated field sensors 20 are trimmed through the adjustable current provided by the adjustable current sources 22 to provide a calibrated sensor signal 24 matching the reference sensor signal 14. The different bias currents provided by the adjustable current sources 22 can differ from the reference current, for example by a few percent. Hence, according to embodiments of the present invention, the field-sensor device 99 incorporates an internal calibration structure, the reference field sensor 10, which can be identical to the calibrated field sensors 20.

The adjustable current sources 22 can comprise a variable active or passive electronic component, for example a variable resistor, capacitor, rheostat, potentiometer, switch or switch array and, for example, can be mechanically or electronically set or controlled. In an implementation of the field sensor device 99 of the present invention, a control circuit 30 controls the adjustable current bias of the calibrated field sensor 20 at a calibrated current different from the reference current so that the calibrated field sensor 20 provides a calibrated sensor signal 24 substantially equal to the reference sensor signal 14 when exposed to the same, common field.

Any one, all of, or any combination of the control circuit 30, the reference field sensor 10, the reference current source 12, the one or more calibrated field sensors 20, and the one or more adjustable current sources 22 can comprise analog or digital electrical circuits providing corresponding analog or digital signals, with or without electromagnetic or magnetic components, and the reference sensor signal 14 or the calibrated sensor signal 24 can be analog or digital signals. The control circuit 30, the reference field sensor 10, the one or more calibrated field sensors 20, the reference current source 12, and the one or more adjustable current sources 22 can be electrically interconnected through one or more wires 80. The control circuit 30 can further comprise circuits such as a current control circuit 32, a comparator circuit 34 such as an operational amplifier configured as a comparator, a converter circuit 36 such as an analog-to-digital or digital-to-analog circuit, or other circuits useful in the field sensor device 99. The converter circuit 36 can convert the reference sensor signal 14, the calibrated sensor signal 24 or both the reference sensor signal 14 and the calibrated sensor signal 24 to digital signals from analog signals or from analog to digital signals, or both. The control circuit 30 can include a storage circuit for storing any one or more of the reference sensor signal 14, the calibrated sensor signal 24 or any converted signals. The circuits can be, for example, silicon circuits, either analog circuits or digital circuits, for example CMOS circuits.

The control circuit 30 can be a discrete or integrated circuit or can include both discrete and integrated components, and can be an analog, digital or mixed-signal circuit. The wires 80 can be any patterned electrical conductor, for example a metal, metal alloy, a conductive metal oxide or a conductive polymer provided using photolithographic methods and materials to connect the various components, integrated circuit dies or circuits integrated on the semiconductor substrate.

The field can be a magnetic field, an electric field, a pressure field or a gravitational field and the field sensor device 99 can be a magnetic field sensor device, an electric field sensor device, a pressure field sensor device or a gravitational field sensor device.

In an embodiment of the present invention and as shown in FIG. 1, the reference field sensor 10 and the one or more calibrated field sensors 20 are biased at a common reference voltage. Such a common voltage bias can improve the field sensor device 99 field sensitivity. Moreover, as used herein, a current source is also a current supply that supplies electrical current and a voltage source is a voltage supply that provides a voltage differential across the voltage source.

By adjusting the adjustable current using the adjustable current source 22 for each calibrated field sensor 20, the calibrated field sensors 20 produce calibrated sensor signals 24 more closely matched to the reference sensor signal 14 produced by the reference field sensor 10. By matching the sensor signals, the sensor signals or a combination of the sensor signals provide a sensor signal with reduced variability and noise and the field sensor device 99 will therefore have improved stray field rejection.

For example, a magnetic position sensor can have a stray-field-rejection requirement of up to 25 mT. Conventional differential signal designs designed to cancel the stray field within a limited range (for example using opposing Hall-effect sensors on a 1 mm radius) provide signals in response to a positive or negative 10 mT magnetic field. Thus, such prior-art designs produce signals in response to fields that are much smaller than the stray field requirement. Even a 1% difference between the sensor signals can result in a 0.7 degree error, which is unacceptable in many applications.

In practice, it is often the case that stray fields are generated by current-carrying electrical conductors (wires) in the vicinity of the field sensor device 99. The generated stray field decays with distance from the wire following a 1/R function (1/distance), and is effectively a uniform stray field when the distance between the field sensors in the field sensor device 99 and the current-carrying wire is greater than one hundred times the distance between the field sensors themselves. In embodiments of the present invention, the stray field is common to both the reference field sensor 10 and the one or more calibrated field sensors 20. In some embodiments of the present invention, the reference and calibrated field sensors 10, 20 are separated by approximately one millimeter, so current-carrying wires producing an effectively uniform stray field can be separated from the field sensor device 99 by approximately 10 cm.

According to embodiments of the present invention, the one or more calibrated field sensors 20 (such as Hall-effect sensors) are individually biased in the current domain. The individual bias current for each calibrated field sensor 20 is derived from the same reference current flowing through a reference field sensor 10 (e.g., another Hall-effect sensor). The resulting voltage of each of the one or more calibrated field sensors 20 and the reference field sensor 10 can be maintained close to the supply rail voltage ($Vac_{dd}$) to improve the field sensor device 99 sensitivity, for example through a feedback loop.

Figure 2:
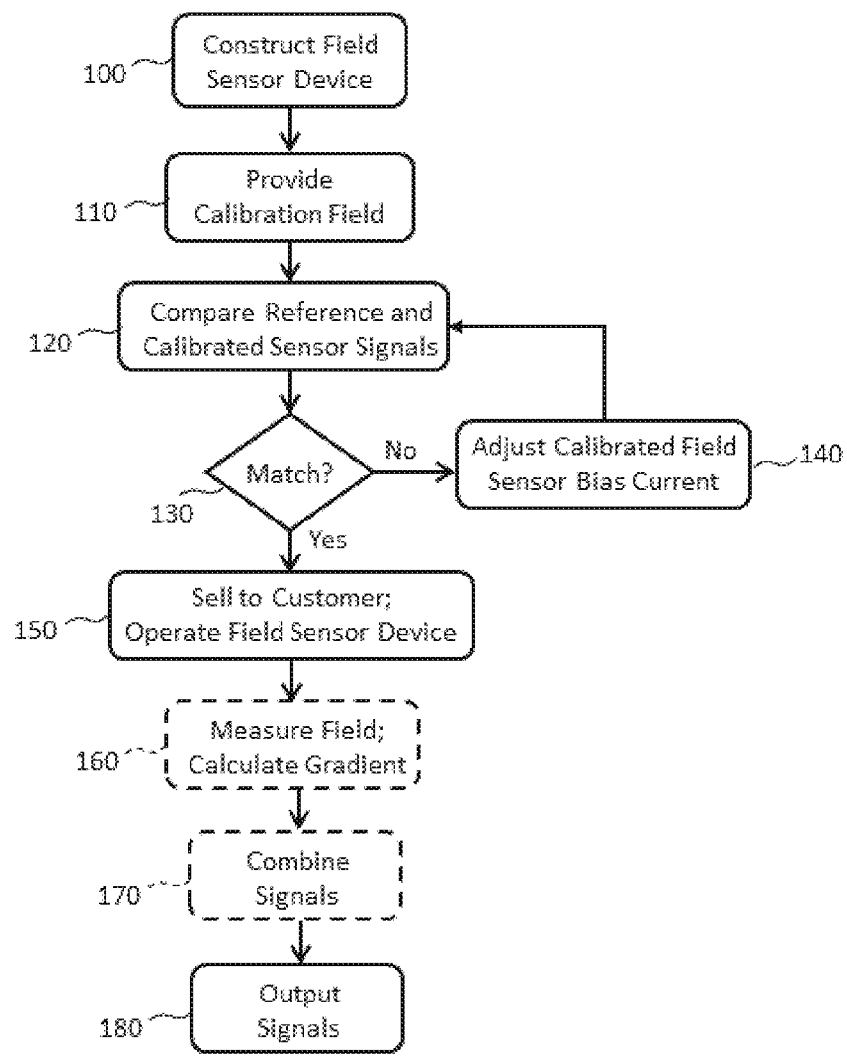
FIG. 2 illustrates a flow chart illustrating a method according to an embodiment of the present invention.

In embodiments of the present invention, each calibrated field sensor 20 is individually adjustable digitally with adjustment steps of 0.5%. This calibration can be performed at the factory before placing the field sensor device 99 into service. Referring to FIG. 2, according to a method of the present invention, a field sensor device 99 is constructed in step 100 and exposed to a uniform calibration field in step 110. The reference sensor signal 14 and calibrated sensor signals 24 are compared in step 120. If the reference sensor signal 14 and the calibrated sensor signals 24 do not match within a predetermined range or tolerance (match step 130), the adjustable current source 22 for each calibrated field sensor 20 is adjusted to provide an adjusted current to each calibrated field sensor 20 in step 140. The reference sensor signal 14 and calibrated sensor signals 24 are compared again in step 120 and tested in step 130. The process repeats until the reference sensor signal 14 and calibrated sensor signals 24 match or are substantially equal, and the field sensor device 99 is calibrated. By match or substantially equal is meant having the same magnitude or value within limitations of the calibration process, tolerance or manufacturing process. The field sensor device 99 can then be placed into service and operated, for example by selling it to a customer in step 150 and placing the field sensor device 99 in an operational field. Once in service, the field sensor device 99 can be used to measure fields and field gradients (when multiple field sensors are present) in optional step 160. Multiple sensed signals can be combined (for example one or more calibrated sensor signals 24 are combined or reference sensor signal 14 is combined with one or more calibrated sensor signals 24 in optional step 170. When the signals are processed as desired, they can be output in step 180, for example to an external system that uses the field sensor device 99 signals in a control system.

Figure 3:
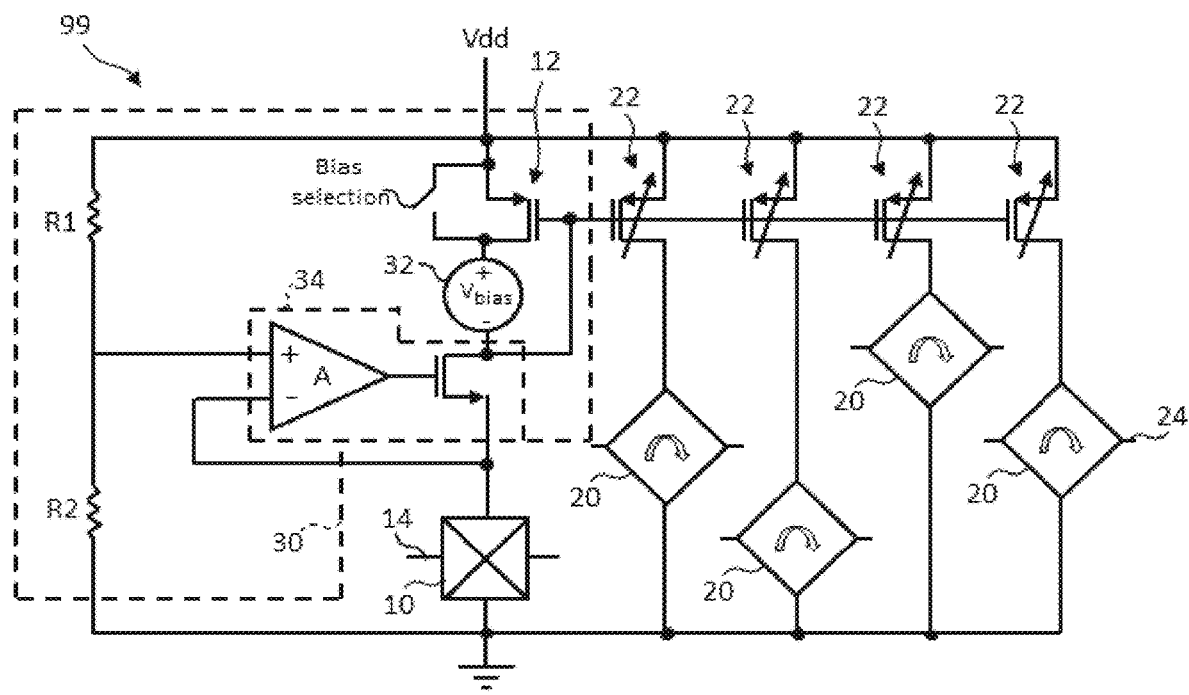
FIG. 3 represents a schematic of an illustrative embodiment of the present invention.

Referring to FIG. 3, according to embodiments of the present invention, a field sensor device 99 comprises a reference field sensor 10 biased with a reference current to produce a reference sensor signal 14 and four calibrated field sensors 20 biased with an adjustable current to produce a calibrated sensor signal 24. The reference field sensor 10 and the four calibrated field sensors 20 can be substantially identical sensors. The calibrated field sensors 20 can be position sensors such as a rotary position sensor that detects the rotational angle of a mechanism (indicated with a curved arrow). In an embodiment, the reference sensor signal 14 and four calibrated sensor signals 24 are electrically connected to a control circuit 30 or external system (not shown) and can be differential signals. Each calibrated field sensor 20 receives an adjustable current from an adjustable current source 22 comprising a transistor controlled in common (a common gate signal connection). Each adjustable current source 22 is individually adjusted in a calibration step 140 (FIG. 2). The reference current source 12 is likewise controlled by a transistor in common with the adjustable current sources 22 but is not necessarily adjustable. A comparator circuit 34 compares a fixed voltage provided by predetermined a series-connected resistors R1 and R2 forming a voltage divider with the voltage provided to the reference field sensor 10 and drives a transistor forming a feedback loop with the reference field sensor 10 and the reference current source 12 control and the adjustable current source 22 control. A voltage control $V_{bias}$ maintains a suitable voltage differential between the reference current source 12 and the feedback loop transistor. A bias selection switch switches between an operational mode and a calibration mode.

Figure 4:
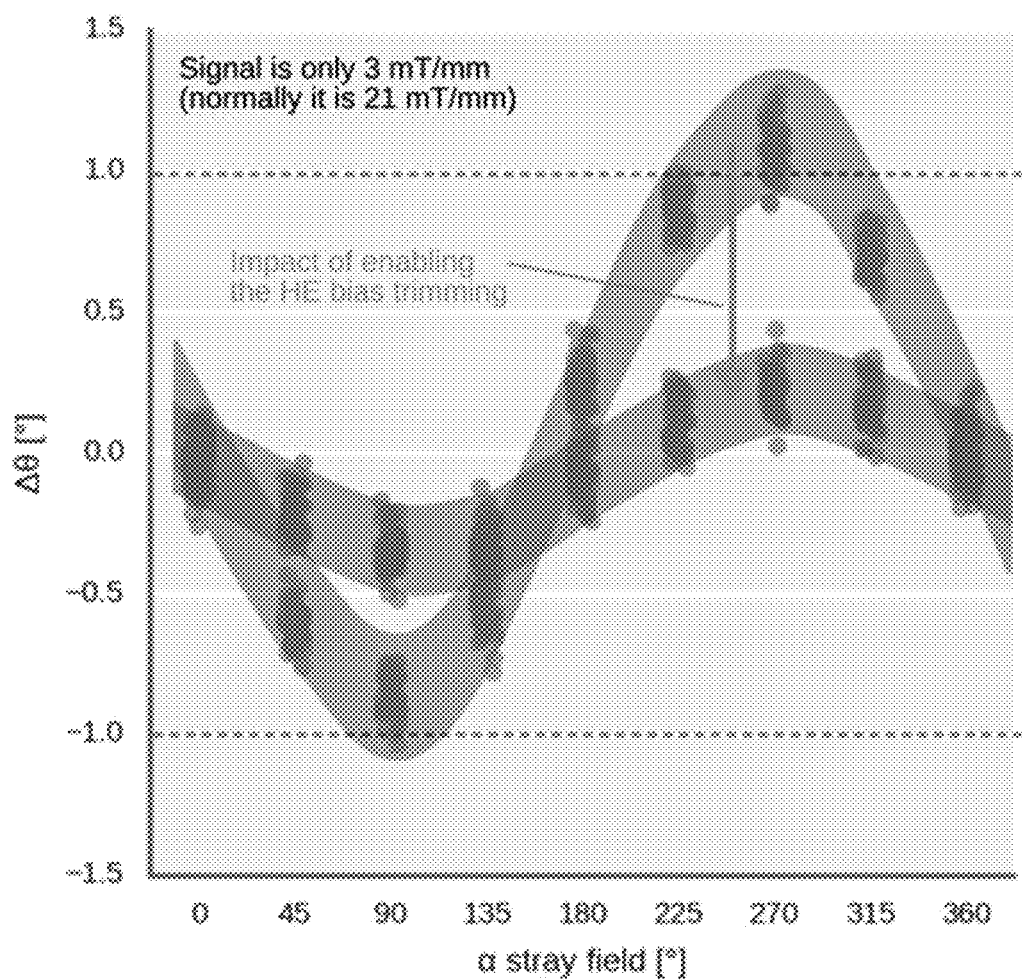
FIG. 4 represents a graph illustrating the performance of an embodiment of the present invention.

Referring to FIG. 4, the embodiment of the present invention illustrated in FIG. 3 has been constructed and tested. The invention is demonstrated to reduce the signal variability for a magnetic positional sensor in the presence of stray fields by a factor of three to four. As shown in FIG. 4, the error in a positional signal for a rotating positional sensor is shown at a variety of different angles separated by 45 degrees. The untrimmed, more highly variable signal exceeds an operational limit of one degree of rotational error at 90 and 270 degrees and at all non-zero angles has an error greater than the less variable signal produced by the inventive, trimmed circuit of FIG. 3, which has an average error substantially less than 0.5 at all tested angles. The test was performed at 35 degrees C. with a 3 mT/mm signal (a factor of 7 less than a conventional signal) with 50 samples measured per angle, demonstrating the superior performance of embodiments of the present invention.

In further embodiments the field sensor device 99 can be operated at different temperatures or stress conditions and the adjustable current adjusted at the different temperatures or stress conditions. The adjustable current source 22 can be controlled by the control circuit 30 to provide a different calibrated sensor current at different temperatures or stress conditions so that the calibrated sensor signals 24 match the reference sensor signal 14 at the different temperatures or stress conditions. In such embodiments, the magnitude of the adjustable currents can be temperature dependent and controlled and adjusted during operation by the control circuit 30.

The reference or calibrated field sensors 10, 20 can be Hall-effect field sensors or magneto-resistive sensors and can comprise a compound semiconductor material. Alternatively, the reference or calibrated field sensors 10, 20 are electric field sensors, pressure field sensors or gravitational field sensors and can, for example, incorporate micro-electro-mechanical systems (MEMS) devices.

In embodiments of the present invention the reference field sensor 10 or the calibrated field sensor 20 can comprise one or more sensor elements, one or more pairs of sensor elements, for example a pair of Hall-effect sensor elements. The reference field sensor 10 or the calibrated field sensor 20 can comprise four sensor elements arranged in two orthogonal pairs to provide redundant measurements in two dimensions. In some embodiments, the first and second dimensions are orthogonal dimensions.

In an embodiment of the present invention the field sensor device 99 comprises bridge field sensors that each include at least four sensor elements. The four sensing elements can be arranged in orthogonal pairs, where each pair has a redundant sensing element, or the four sensing elements can be separate. The different sensing elements can be provided in a common technology or common integrated circuit or in different technologies or integrated circuits and can be integrated into a CMOS integrated circuit.

In some embodiments of the present invention the field sensor device 99 can have multiple calibrated field sensors 20 that measure the field in a common direction. Multiple field sensor devices 99 can be combined in a system to provide measurements in different field directions. Each of the multiple field sensor devices 99 can be, but are not necessarily, trimmed by adjusting the adjustable current of the adjustable current sources 22 in response to fields having different field orientations or non-correlated directions having no cross talk.

The reference field sensor 10 and the calibrated field sensor 20 can be magnetic sensors such as Hall-effect sensors, magnetoresistive sensors such as extreme magnetoresistive sensors (XMR) extraordinary magnetoresistive sensors (EMR), giant magnetoresistive sensors GMR, tunnelling magnetoresistive sensors (TMR), colossal magnetoresistive sensors (CMR) or anisotropic magnetoresistive sensors (AMR).

Each of the reference or calibrated field sensors 10, 20 can be provided, for example, in an integrated circuit, discrete elements or as separate integrated circuit components (such as bare die) mounted on a sensor device substrate, such as a glass, ceramic, polymer or semiconductor substrate.

The field sensor device 99 can be electrically connected to an external system (not shown) that is electrically connected through wires 80 to the control circuit 30 or reference or calibrated field sensors 10, 20. The control circuit 30, the reference or calibrated field sensors 10, 20 can be disposed on different or common substrates, surfaces or devices.

The field sensor device 99 can comprise a device substrate and the reference field sensor 10, the calibrated field sensor 20 and the control circuit 30 can be disposed on the device substrate and electrically connected with electrical conductors such as wires 80, and can include single wires 80 or buses comprising multiple wires 80 that can communicate power, ground, and control or sensor signals to or from the field sensor device 99, the control circuit 30, the reference field sensor 10 or the calibrated field sensor 20. The device substrate can be any substrate having one or more surfaces on which the reference and calibrated field sensors 10, 20 can be disposed and electrically connected. The control circuit 30 can also be, but is not necessarily, disposed on a surface of the substrate.

In some embodiments the device substrate is or comprises a semiconductor substrate and the control circuit 30 is formed in or on the semiconductor substrate. In another embodiment the control circuit 30 is an integrated circuit disposed on the device substrate and the device substrate is a dielectric or has a dielectric layer or surface. Thus, the device substrate can comprise a substrate material that is at least partially different from a material of the reference and calibrated field sensors 10, 20 and is at least partially different from a material of the control circuit 30. In some embodiments the reference and calibrated field sensors 10, 20 comprise compound semiconductors, the control circuit 30 comprises a silicon semiconductor, and the substrate material comprises a dielectric. In another embodiment the reference and calibrated field sensors 10, 20 comprise compound semiconductors and the device substrate material comprises a silicon semiconductor and the control circuit 30 is formed in or as part of the silicon semiconductor.

The device substrate can be mounted on a system substrate, for example a system substrate of another device or system. Any one of the device substrate, the control circuit 30, the reference field sensor 10 or the calibrated field sensor 20 can be a micro-transfer printed component and comprise a fractured, broken or separated tether. The control circuit 30, the reference field sensor 10 or the calibrated field sensor 20 can be packaged integrated circuits or bare die and can be micro-transfer printed onto the device substrate and the device substrate can be micro-transfer printed onto the system substrate.

Any of the elements of the field sensor device 99 of the present invention can be provided in a common circuit or provided in a common integrated circuit, package or share common electrical components. Alternatively, any of the elements of the field sensor device 99 of the present invention can be provided in separate components, for example a combination of discrete circuit components or integrated circuits. Any of the components can be analog components, include analog-to-digital convertors or can be digital components or mixed-signal circuits or a combination of circuit types and electronic devices. The control circuit 30 can include a CPU with a program stored in a memory, a stored program machine, a state machine or the like.

Any one or all of the various components can be disposed on a printed circuit board or on a semiconductor substrate, or any one or all of the various components can be integrated as a circuit in or on the semiconductor substrate, or some combination of integrated circuits provided on the semiconductor substrate and circuits formed in or the semiconductor substrate.

One or more integrated circuit components or elements of the field sensor device 99 such as the control circuit 30, can be disposed on the reference or calibrated field sensor 10, 20 as bare die deposited by micro-transfer printing and electrically connected. Alternatively, the reference or calibrated field sensor 10, 20 can be disposed on the control circuit 30 as bare die deposited by micro-transfer printing and electrically connected. Micro-transfer printed devices can comprise a broken or separated tether as a consequence of the micro-transfer printing process. The control circuit 30 can be provided as a photolithographically defined circuit in a semiconductor substrate and the reference or calibrated field sensor 10, 20 can be disposed on the semiconductor substrate as bare die and electrically connected to the control circuit 30 using photolithographic processes and materials.

Embodiments of the present invention can be constructed by providing a device substrate and disposing the reference or calibrated field sensor 10, 20 and control circuit 30 as integrated circuits on a surface of the device substrate. The integrated circuits can be disposed on the device substrate surface by micro-transfer printing them from corresponding source wafers onto the device substrate surface by breaking or separating tethers physically connecting the integrated circuits to the source wafer with a stamp, adhering the integrated circuits to the stamp, and then transporting the integrated circuits to the device substrate surface. Alternatively, the device substrate surface can be or include a semiconductor layer and one or more or any portion of each of the reference or calibrated field sensor 10, 20 and control circuit 30 are formed in the semiconductor layer and electrically connected with any integrated circuits disposed on the device substrate surface (for example using micro-transfer printing) using wires 80 on the device substrate surface, for example by using photolithographic or printed circuit board methods and materials. Alternatively, the control circuits 30 or reference or calibrated field sensor 10, 20 can be photolithographically defined in a semiconductor substrate.

The device substrate can be one of many substrates with one or more surfaces capable of supporting or receiving the reference or calibrated field sensor 10, 20 and control circuit 30, for example a glass, plastic, ceramic or semiconductor substrate with two opposing relatively planar and parallel sides. The device substrate can have a variety of thicknesses, for example from 10 microns to several millimeters. The device substrate can be a portion or surface of another device and can include electronic circuitry.

Methods of forming micro-transfer printable structures are described, for example, in the paper '*AMOLED Displays using Transfer-Printed Integrated Circuits*' (Journal of the Society for Information Display, 2011, DOI #10.1889/JSID19.4.335, 1071-0922/11/1904-0335, pp. 335-341) and U.S. Pat. No. 8,889,485, referenced above. For a discussion of micro-transfer printing techniques, see U.S. Pat. Nos. 8,722,458, 7,622,367 and 8,506,867. Micro-transfer printing using compound micro-assembly structures and methods can also be used with the present invention, for example, as described in U.S. patent application Ser. No. 14/822,868, filed Aug. 10, 2015, entitled "Compound Micro Assembly Strategies and Devices". In an embodiment the field sensor device 99 is a compound micro-assembled device. Additional details useful in understanding and performing aspects of the present invention are described in U.S. patent application Ser. No. 14/743,981, filed Jun. 18, 2015, entitled *"Micro Assembled LED Displays and Lighting Elements"*.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A field-sensor device comprising:
   a reference field sensor providing a reference sensor signal in response to a field,
   a calibrated field sensor providing a calibrated sensor signal in response to the field,
   a reference circuit connected to the reference field sensor and adapted to receive a reference signal,
   an adjustable circuit connected to the calibrated field sensor and adapted to receive a calibrated signal,
   wherein, when the adjustable circuit is adjusted with the calibrated signal, said calibrated signal being different from the reference signal, the calibrated field sensor provides a calibrated sensor signal substantially equal to the reference sensor signal, and
   wherein said field sensor device is arranged to be exposed, when in a calibration mode, to a uniform calibration field and, when in operational mode, to an operational field being a field gradient.

2. The field-sensor device of claim 1, wherein the field-sensor is a field-gradient sensor.

3. The field-sensor device of claim 1, arranged to determine a difference signal or gradient signal based on the reference sensor signal and the calibrated sensor signal.

4. The field-sensor device of claim 1, comprising a plurality of calibrated field sensors and adapted to determine a difference based on at least two of said calibrated field sensors and/or between said reference field sensor and at least one calibrated field sensor of said plurality.

5. The field-sensor device of claim 1, wherein the field-sensor device is a magnetic field-sensor device.

6. The field-sensor device of claim 1, wherein the reference circuit is arranged to provide a biasing signal to the reference field sensor.

7. The field-sensor device of claim 6, wherein the reference circuit is a reference current source.

8. The field-sensor device of claim 1, wherein the adjustable circuit is arranged to provide a biasing signal to the calibrated field sensor.

9. The field-sensor device of claim 8, wherein the adjustable circuit is an adjustable current source.

10. The field-sensor device of claim 1, wherein any one, all of, or any combination of the reference field sensor and the calibrated field sensor comprise one or more analog electrical circuits.

11. The field-sensor device of claim 1, wherein any one, all of, or any combination of the reference field sensor and the calibrated field sensor comprise one or more digital electrical circuits.

12. The field-sensor device of claim 1, comprising a comparator that compares the reference sensor signal to the calibrated sensor signals.

13. The field-sensor device of claim 1, wherein the reference field sensor, the calibrated field sensor or both the reference field sensor and the calibrated field sensor are digital sensors, or wherein the reference sensor signal, the calibrated sensor signal or both the reference sensor signal and the calibrated sensor signal are digital signals.

14. The field-sensor device of claim 1, comprising a converter to convert the reference sensor signal, the calibrated sensor signal or both the reference sensor signal and the calibrated sensor signal into digital signals.

* * * * *